United States Patent [19]
Mehrad

[11] Patent Number: 5,659,500
[45] Date of Patent: Aug. 19, 1997

[54] NONVOLATILE MEMORY ARRAY WITH COMPATIBLE VERTICAL SOURCE LINES

[75] Inventor: Freidoon Mehrad, Plano, Tex.

[73] Assignee: Texas Instruments Incorporated, Dallas, Tex.

[21] Appl. No.: 533,981

[22] Filed: Sep. 26, 1995

[51] Int. Cl.[6] .......................... H01L 27/115; H01L 21/82
[52] U.S. Cl. ................... 365/185.05; 365/185.11; 365/185.16; 257/316; 257/315
[58] Field of Search ............ 365/185.05, 185.11, 365/185.16; 257/315, 316, 317, 318, 905, 906, 907

[56] References Cited

U.S. PATENT DOCUMENTS

| | | | |
|---|---|---|---|
| 5,523,969 | 6/1996 | Okazawa | 257/316 |
| 5,566,106 | 10/1996 | Bergemont | 257/315 |

*Primary Examiner*—David C. Nelms
*Assistant Examiner*—Vu A. Le
*Attorney, Agent, or Firm*—Theodore D. Lindgren; Leo N. Heiting; Richard L. Donaldson

[57] ABSTRACT

A nonvolatile memory array has a plurality of diffused horizontal source lines (17), each source line (17) positioned between a pair of parallel horizontal stack conductors (ST). The plurality of the diffused horizontal source lines (17) are connected to at least one common vertical source conductor (17a). The common vertical source conductor (17a) includes continuous diffused regions (11) under each of said pair of parallel horizontal stack conductors (ST). In addition, the common vertical source conductor (17a) includes a metal conductor coupled to the continuous diffused regions at contacts (SC) located between the pairs of parallel horizontal stack conductors (ST). As a result, the stack conductors (ST) are straight. The straight-stack conductor (ST) configuration allows use of less space between a vertical source conductor (17a) and adjacent drain-column lines (18) and eliminates any need for use of vertical columns of dummy cells (10). Optional use of a straight-stack (ST) that is trimmed to a narrower width at the vertical source conductor (17a) results in a more certain conductive path under the straight stack conductors (ST).

9 Claims, 5 Drawing Sheets

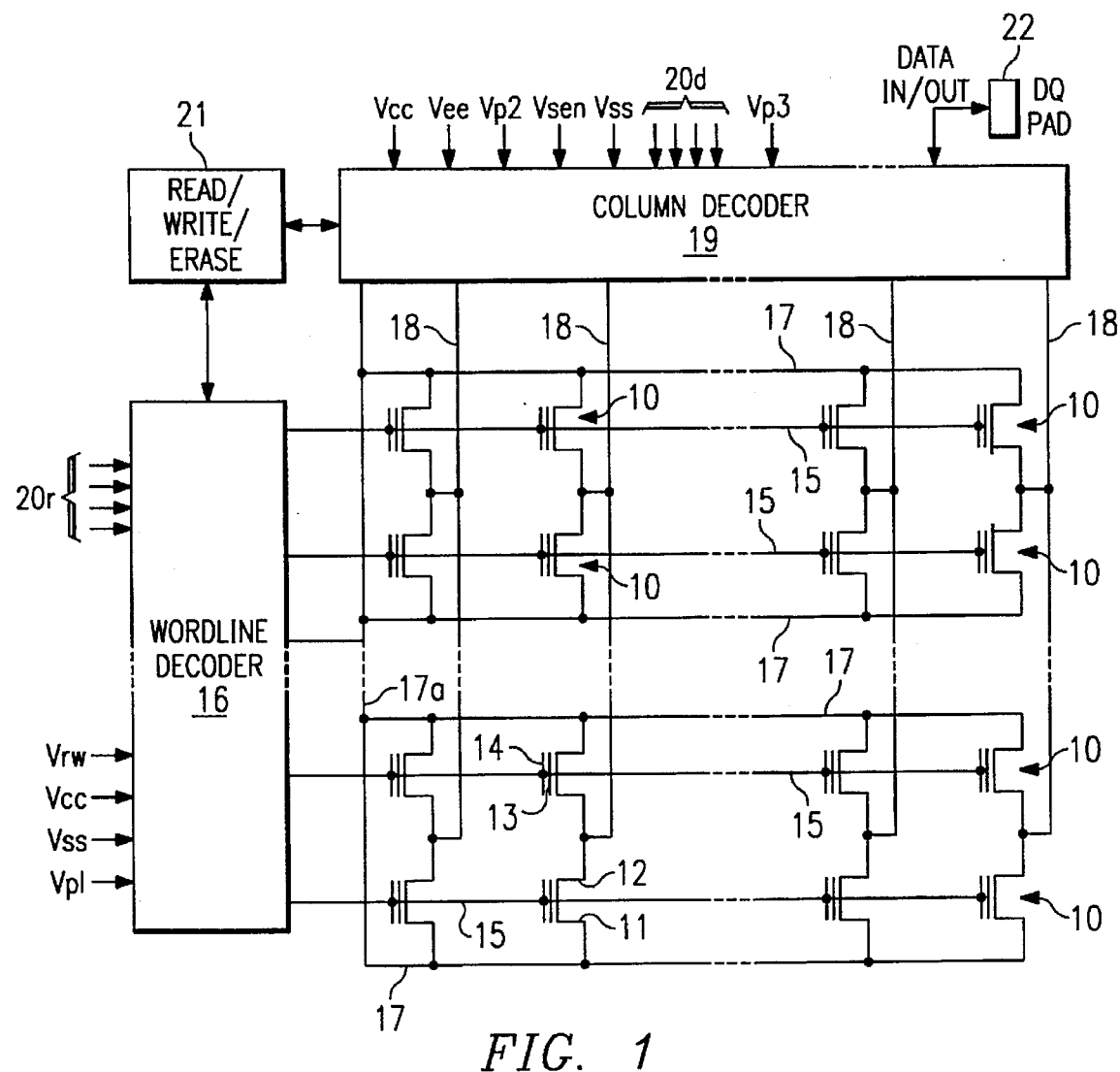
FIG. 1
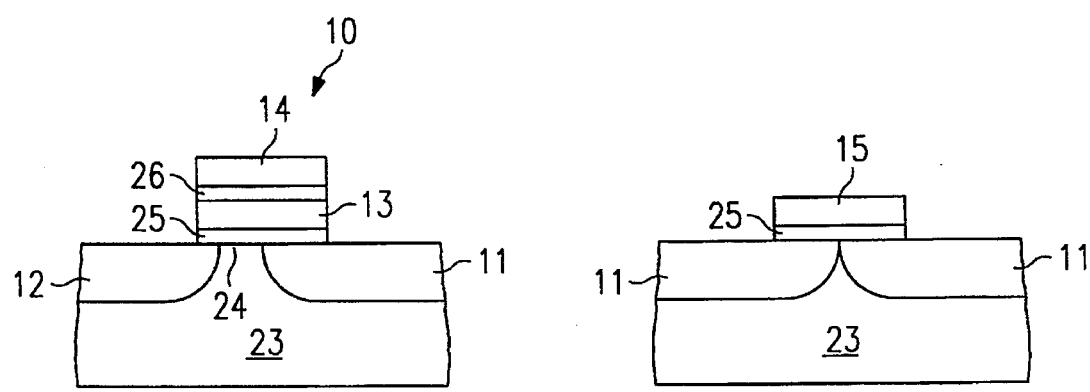
FIG. 3
FIG. 5

NONVOLATILE MEMORY ARRAY WITH COMPATIBLE VERTICAL SOURCE LINES

BACKGROUND OF THE INVENTION

This invention relates to an array configuration for nonvolatile memories of the floating-gate type, such as Flash Electrically-erasable, Programmable Read-Only-Memory (Flash EPROM) arrays. In particular, this invention relates to memory arrays with cells having two stacked conducting layers (stacks), commonly phosphorous-doped polycrystalline silicon (polysilicon or poly) layers. The upper conducting layer forms wordlines and control gates. The lower conducting layer forms floating gates that are located under the control gates. The term "stack", as used herein, includes either a single-layer workline conductor or the combination of the wordline conductor and the underlying conductor.

One such nonvolatile memory array has diffused horizontal source lines formed between pairs of horizontally-directed stacks. The horizontal source lines are connected to metal vertical source lines. The metal vertical source lines are located between groups of columns of cells, each group having perhaps sixteen columns of cells. In many flash EEPROM devices of the foregoing type, the conventional way of connecting the diffused horizontal source lines to the metal vertical source lines is to form a contact at each intersection of such lines. Because of minimal photolithographic dimensions, in prior-art structures the stacks on either side of each source contact are bent in a manner that allows more room for the contact structure, including insulator space and including masking tolerances, to the diffused horizontal source line. The bend in the stacks results in a need for an area with a relatively large horizontal distance for formation the vertical source line. That distance is greater than the horizontal distance needed for each column of cells. As a result, the horizontal spacing between field oxide regions is non-uniform, being wider at the location of the vertical source lines than the horizontal spacing in the groups of columns of cells. Because the spacing between field oxide is non-uniform, the field oxide regions adjacent the vertical source lines tend to be distorted in comparison to the field oxide regions between the grouped columns. In some cases, the distortion is sufficient that dummy columns of cells are used on each side of the metal vertical source line, resulting in an even greater area of non-functional structure on the chip.

These source contacts, and the metal vertical source line connected to those contacts, are needed because the regions under the stack are non-conductive.

The diffused sources, and the diffused horizontal source lines, of Flash EPROMs of the type discussed here are formed from both arsenic and phosphorous implants. When subjected to a drive step at relatively high temperatures, the implanted phosphorous forms a diffused region that extends a short distance under the stack. This short extension, or underlap, under the lower-level floating gate of the stack, is used for flash erasure of the floating gates by Fowler-Nordheim tunneling.

As the minimum photolithographic distances become smaller, the extension of the diffused phosphorous region under the stack forms a greater percentage of the width of the floating gate.

There is a great and continuing need to build smaller memory cells and, therefore, more memory cells on silicon substrate. There is also a great and continuing need for memory-cell layouts that are not only small, but are easy to manufacture as well as easy to shrink in size as minimum photolithographic distances decrease.

SUMMARY OF THE INVENTION

Accordingly, this invention describes a Flash EPROM memory array layout and method. The layout and method have straight stacks, rather than the bent stacks of the prior-art. The straight stacks are positioned above, and insulated from, diffused vertical source lines. Metal vertical source lines are connected in parallel with each of the vertical diffused source lines. The metal vertical source lines are formed simultaneously with the metal drain-column lines. The metal vertical source lines and the metal drain-column lines have equal horizontal space throughout the width of the array, as do the field oxide regions. The memory array has a simple layout, requires less silicon area on a semiconductor substrate, is easily manufacturable, is easy to shrink, and requires no dummy columns adjacent each side of the vertical source lines.

The straight-stack configuration of this invention is particularly useful in Flash EPROM arrays that have narrow stack widths. The invention is particularly useful for the narrow stack widths made possible by increasingly smaller minimum-photolithographic-distance capabilities of integrated-circuit manufacturing equipment.

The array layout of this invention is formed by implanting phosphorous on both sides of the narrow stacks to form a vertical diffused source line simultaneously with forming of the sources of the cells. When subjected to the high-temperature drive step, the phosphorous implants completely underlap the narrow stacks to form a continuously conductive vertical diffused source line for use during flash erasure. In effect, the horizontal diffused source lines are connected to form a vertical diffused source line with no extra processing steps. Contacts between the vertical diffused source line and a parallel vertical metal source line are formed in locations uniformly patterned with the drain-column-line contacts. The metal vertical source lines are uniformly patterned, and formed, with the metal drain-column lines.

Optionally, if the stack layers are not of minimum photolithographic width, the width of the straight stack is formed with a narrower width at the intersection with the vertical source lines. Alternatively, a separate mask/etch process is used to narrow the width of the stack. Use of this smaller width increases the probability for electrical connection of the source diffusions under the stack when using conventional phosphorous implant procedures.

BRIEF DESCRIPTION OF THE DRAWINGS

In the drawings:

FIG. 1 is an electrical schematic diagram, in partial block form, of a nonvolatile memory cell array;

FIG. 3 is a cross-section of a typical floating-gate cell of the type used in the memory cell arrays of FIGS. 1, 2 and 4, the cross-section designated by line A—A' in FIG. 2;

FIG. 5 is a cross-section of the stack connection of this invention indicating the joined vertical source line diffusions of the device of FIG. 4, the cross-section designated by line B—B' of FIG. 4;

DETAILED DESCRIPTION OF THE INVENTION

Figure 2:
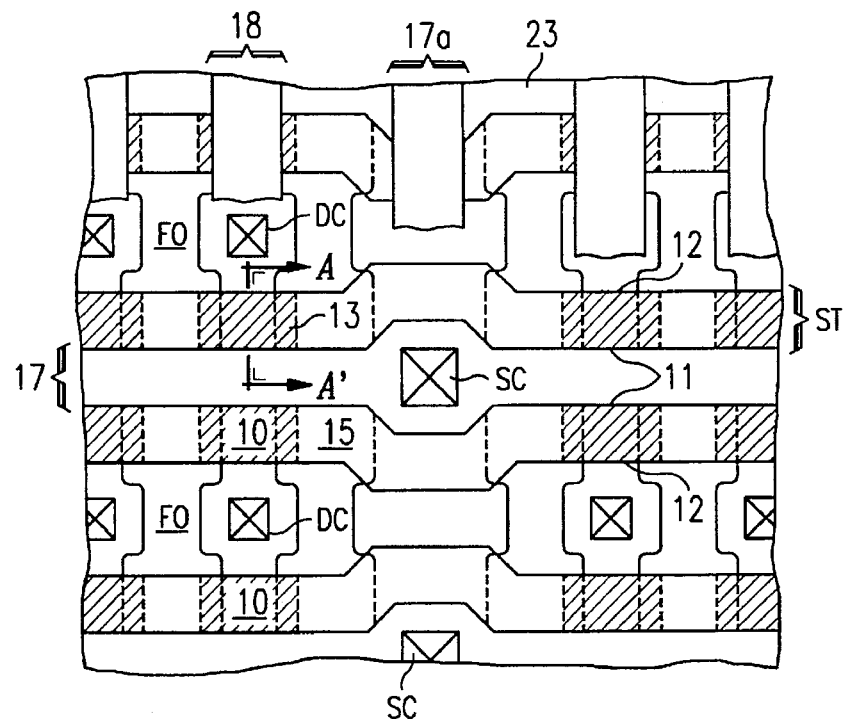
FIG. 2 is an enlarged plan view of the nonvolatile array of FIG. 1 showing a small part of a prior-art memory cell array layout having bent stacks around source contacts.

Referring to FIG. 1, an example array of memory cells, which is an integral part of a memory chip, is shown for the purpose of illustrating use of the method of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20r and to signals from Read/Write/Erase control circuit 21 (or microprocessor 21), to apply a preselected positive voltage $V_{CC}$ (approx. +5 V) to the selected wordline 15, and to apply a low voltage (ground or $V_{SUB}$) to deselected wordlines 15. The column decoder 19 functions to apply a preselected positive voltage $V_{SEN}$ (approx. +1 V) to at least the selected drain-column line 18 and to apply a low voltage (0 V) to the source line 17. The column decoder 19 also functions, in response to signal on address lines 20d, to connect the selected drain-column line 18 of the selected cell 10 to the DATA IN/OUT terminal. The conductive or nonconductive state of the cell 10 connected to the selected drain-column line 18 and the selected wordline 15 is detected by a sense amplifier (not shown) connected to the DATA IN/OUT terminal 22.

During a flash-erase mode, the column decoder 19 may function to leave all drain-column lines 18 floating (connected to a high impedance such as field-effect transistor biased in "OFF" condition). The wordline decoder 16 functions to connect all the wordlines 15 to reference potential $V_{SUB}$, which may be ground. The column decoder 19 also functions to apply a high positive voltage $V_{EE}$ (approx. +10 V to +15 V) to all the source lines 17. These erasing voltages create sufficient field strength across the gate oxide region to generate a Fowler-Nordheim tunnel current that transfers charge from the floating gate 13, erasing the memory cell 10. Since the potential on the wordline 15 is 0 V, the cell 10 remains in the nonconducting state during erase. For that reason, and also by reason of the fact that the drain 12 is floated, no channel-hot carriers are generated.

In a write or program mode, the wordline decoder 16 may function, in response to wordline address signals on lines 20r and to signals from Read/Write/Erase control circuit 21, (or microprocessor 21) to place a preselected first programming voltage $V_{P1}$ (approx. +12 V) on a selected wordline 15, including a selected control-gate 14. Column decoder 19 also functions to place a second programming voltage $V_{P2}$ (approx. +5 to +10 V) on a selected drain-column line 18 and, therefore, the drain 12 of selected cell 10. The source lines 17 are connected to reference potential $V_{SUB}$, which may be ground. All of the deselected drain-column lines 18 are connected to reference potential $V_{SUB}$ or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region (with $V_{P1}$ at 0 V). For memory cells 10 fabricated in accordance with the example embodiment, the coupling coefficient between a control gate 14/wordline 15 and a floating gate 13 is approximately 0.6. Therefore, a programming voltage $V_{P1}$ of 12 V, for example, on a selected wordline 15, including the selected control gate 14, places a voltage of approximately +7.2 V on the selected floating gate 13. The voltage difference between the floating gate 13 (at approx. 7.2 V) and the grounded (approx. 0 v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive with a positive read voltage on control gate 14, a state which is read as a "zero" bit. Deselected cells 10 have source-drain paths under the floating gate 13 that remain conductive, and those cells 10 are read as "one" bits.

FIG. 2 is an enlarged plan view of a small part of a memory cell 10 array layout, the figure illustrating a prior-art stack ST and source contact SC structure for use in the memory array of FIG. 1. The minimum lithographic distance is represented by the width of one side of a source contact SC or of a drain contact DC. The vertical source lines 17a separate groups of perhaps sixteen columns of cells 10. In this layout configuration, the source contacts SC between vertical metal source line 17a and the horizontal source lines 17 require bending of the stacked layers ST away from each source contact SC to allow sufficient space for insulation and for mask alignment variations. (Similar spacing is required for the drain contacts DC.) The bends in the stacks ST result in a need for a relatively large horizontal distance between the grouped columns of cells 10. That distance is greater than the horizontal distance required for a column of cells 10. As a result, the spacing between field oxide regions FO is non-uniform, the spacing being greater at the vertical source line 17a. Because the spacing between field oxide regions FO is non-uniform, the field oxide regions FO adjacent the vertical source lines 17a tend to be distorted in comparison to the field oxide regions FO between identical cells 10. In some cases, the distortion is sufficient that dummy columns of cells 10 are used on each side of the vertical source lines 17a, resulting in even more non-functional space on the chip.

Figure 4:
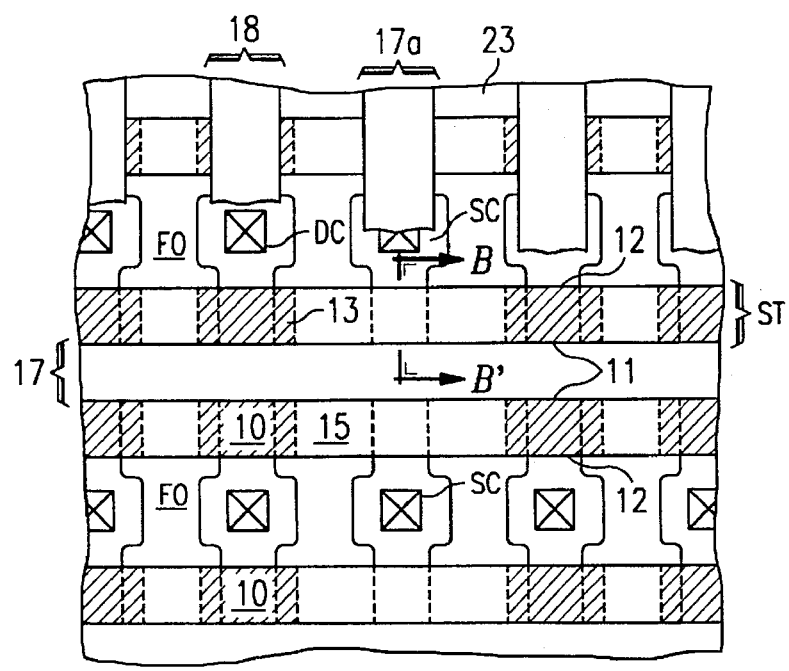
FIG. 4 is an enlarged plan view of the nonvolatile array of FIG. I showing a small part of the memory cell array of this invention, the array having straight stack configuration and source contacts having a uniform pattern with the drain contacts.

FIG. 3 is a cross-section of a typical floating-gate cell 10 of the type used in the memory cell arrays of FIGS. 1, 2 and 4, taken along line A—A' of FIG. 2. Source 11 and drain 12 are formed by impurity diffusions of one conductivity-type in a semiconductor substrate 23 having a second conductivity-type. The source 11 is typically formed by a diffusion of two types of impurities, usually arsenic and phosphorous. The phosphorous impurity of source 11 extends under the floating gate 13 to form a tunneling window for flash erase. The area of substrate 23 between the source 11 and the drain 12 is the cell channel 24. The floating gate 13 is formed from a layer of doped polysilicon insulated from the channel 24 by gate insulator 25. The polysilicon control gate 14, which is a part of the wordline 15 of FIG. 1, is insulated from the floating gate 13 by an inter-level insulator 26.

As manufacturing processes using smaller minimum lithographic distances are developed, memory arrays are constructed with smaller stack ST widths. On the other hand, the source junction underlap distance, which is needed for a proper flash erase, has not been scaled down with the same ratio as the stack ST widths. This evolution permits source 11 diffusions to be made on both sides of the stack ST such that the diffusions connect under the stack to form a vertical conductive path between horizontal source lines 17.

Referring now to FIGS. 4 and 5, FIG. 4 is an exemplary array layout of this invention and FIG. 5 illustrates a cross-section at line B—B' of FIG. 4. FIG. 5 shows diffusions under stack ST to form the diffused part of vertical source line 17a. The diffused part of vertical source line 17a is formed by implanting phosphorous on both sides of each stacked layer ST at the same time the sources 11 and horizontal source lines 17 are formed. Parallel metal vertical column lines are formed over the continuous diffusion and connected at contacts SC to lower the resistance of the combined vertical source conductor 17a. FIG. 4 also illustrates a narrower width of space required by the vertical source line 17a of this invention as compared to the width of space required by the prior-art vertical source line 17a of FIG. 2. The width of space required by the vertical source line of FIG. 4 is identical to the width of space required by one column of cells 10. In effect, there are no variations in the spacing between field oxide regions FO. And any need for the two vertical "dummy" columns of cells 10 on either side of a vertical source line 17a is eliminated, along with the space required for those two dummy columns of cells 10.

Note that FIGS. 4 and 5 indicate one-layer stacks ST over the underlapped, connecting diffusions of vertical column line 17a. Optionally, a two-layer stacks, including floating-gate 13 equivalents are positioned over the underlapped, connecting diffusions of vertical column line 17a.

In summary, FIGS. 4 and 5 illustrate a nonvolatile memory array having a plurality of diffused horizontal source lines 17, each source line 17 positioned between a pair of parallel horizontal stack conductors ST. The memory array includes a plurality of the diffused horizontal source lines 17 connected to at least one common vertical source conductor 17a. The common vertical source conductor 17a includes continuous diffused regions 11 under each of said pair of parallel horizontal stack conductors ST. In addition, the common vertical source conductor 17a includes a metal conductor coupled to the continuous diffused regions at contacts SC located between the pairs of parallel horizontal stack conductors ST.

Figure 6:
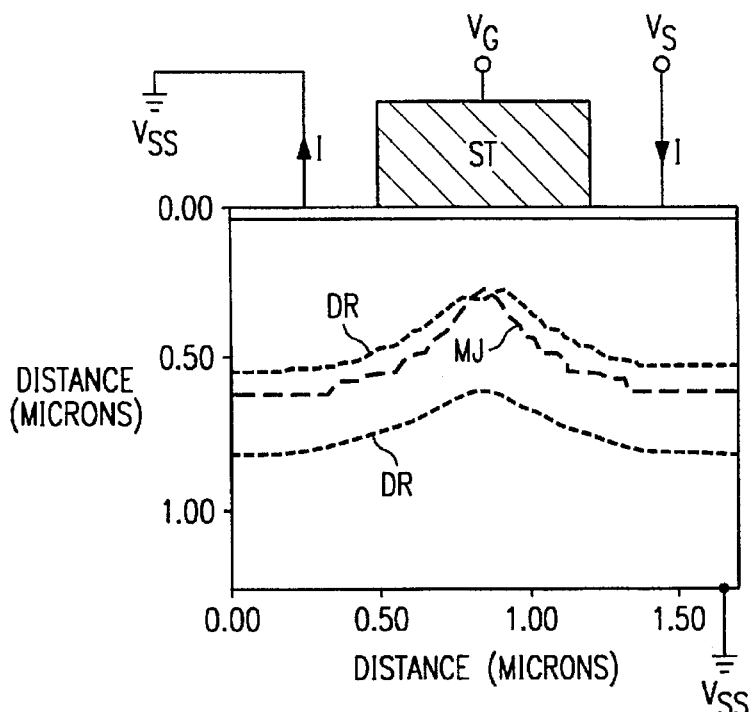
FIG. 6 is a simulated cross-sectional view of the stack connection of this invention, indicating the joined symmetrical diffusions under the stack.
Figure 7:
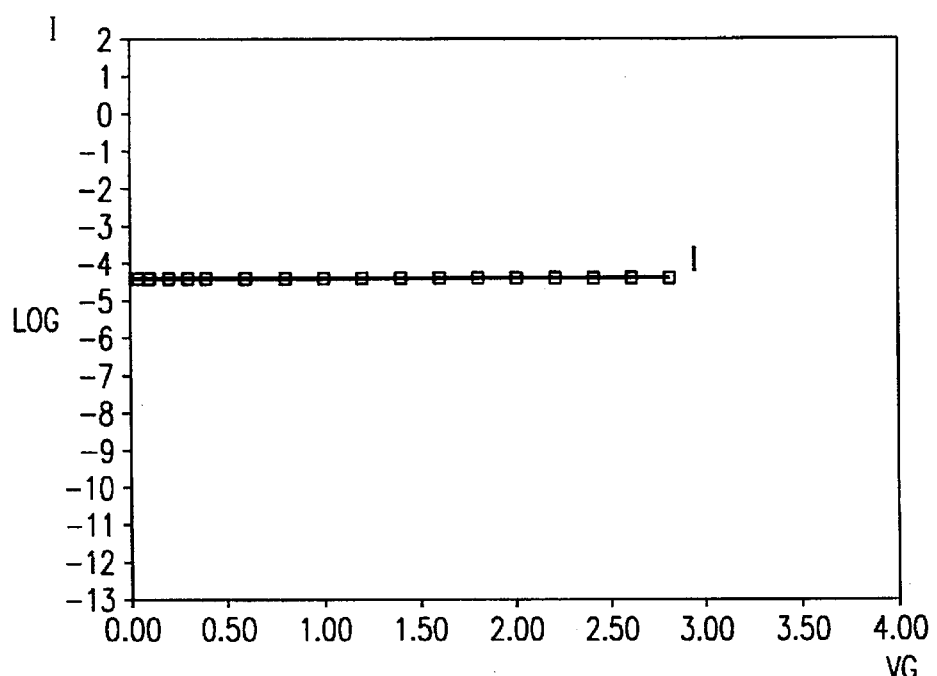
FIG. 7 is an I–$V_G$ measurement plot for the stack configuration of FIG. 6 as the control gate voltage $V_G$ is varied.

FIG. 6 is a simulated cross-sectional view of a field-effect structure having symmetrical source-type diffusions that represent the horizontal source line 17 diffusions and the vertical source line 17a diffusions of this invention on either side of the straight stack ST, respectively. In FIG. 6, lines DR represent the depletion region and line MJ represents the metallurgical junction. As can be seen, the source 11 diffusions used in a standard flash process merge under the stack ST to form a conductive path that is not affected by the voltage on stack ST. This fact is illustrated in FIG. 7, where current I between left and right sides of the gate is plotted versus gate voltage $V_G$.

The source-type diffusions of FIG. 6 are formed by subjecting the masked substrate 23 to a phosphorous implant in the range of about $3 \times 10^{14}$ to $6 \times 10^{14}$ ions/cm$^2$ at an energy of approximately 60 KeV. The substrate is then subjected to an arsenic implant in the range of about $6 \times 10^{15}$ to $8 \times 10^{15}$ ions/cm$^2$ at an energy of approximately 100 KeV. The implants are then subjected to a drive step at about 1000° C. for approximately 35 to 50 minutes.

Figure 8:
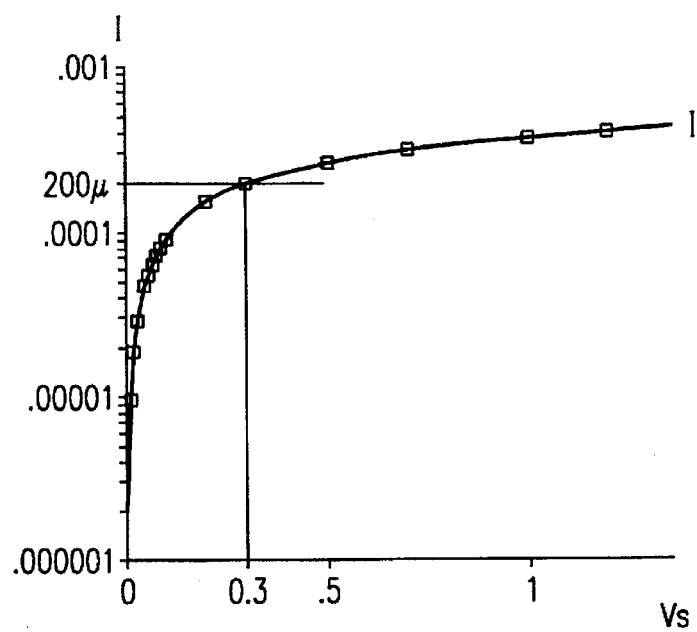
FIG. 8 is an I–$V_S$ measurement plot for the stack configuration of FIG. 6, the stack having a width of 0.7 μm and the stack grounded.

Referring now to FIG. 8, there is depicted a graph of simulated source current I versus the source voltage $V_S$ (with all other terminals at ground potential) for the device of FIG. 6. The stack ST width used for the graph of FIG. 8 is 0.7 µm. As can be seen, when the source voltage $V_S$ is 0.3 V and all the other terminals are at ground potential, there is a current I of 200 microamperes flowing through the silicon under the stack ST.

Figure 9:
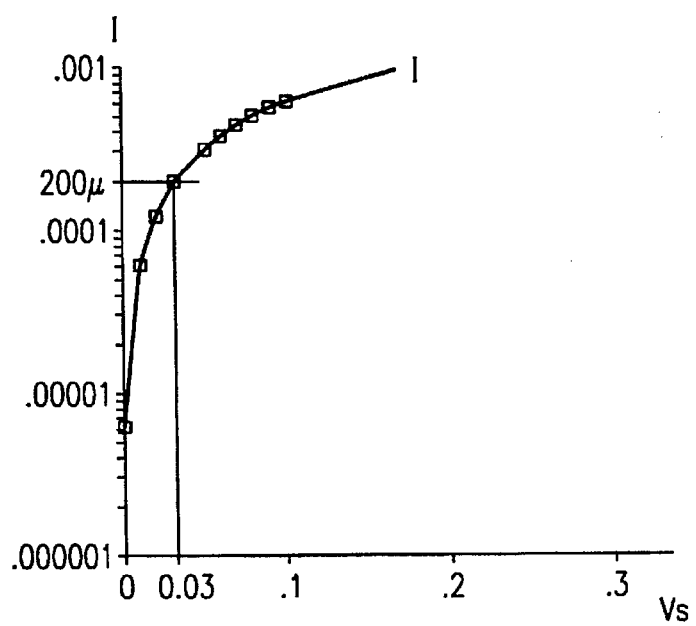
FIG. 9 is an I–$V_S$ measurement plot for the stack configuration of FIG. 6, the stack having a width of 0.5 μm and the stack grounded.

FIG. 9 is a graph similar to that of FIG. 8, also illustrating simulated source current I versus the source voltage $V_S$ (with all other terminals at ground potential), but for a FIG. 6 structure having a stack width of 0.5 cm. In FIG. 9 a source voltage $V_S$ of 0.03 volts when all the other terminals are at ground potential gives a current I of 200 microamperes.

Figure 10:
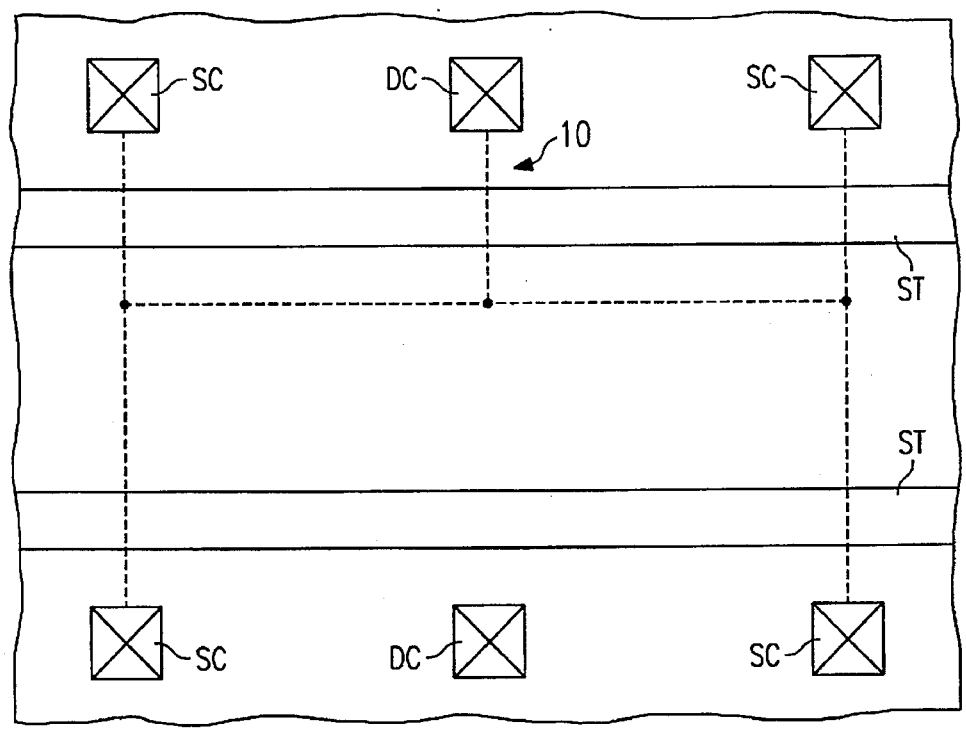
FIG. 10 is a plan view of a small part of a memory cell array having a straight stack and illustrating the four nearest source contacts to a programmed cell.

Normal programming of a flash cell 10 requires about 600 to 700 microamperes of current available in the channel 24. As shown in FIG. 10, the maximum programming current of 800 microamperes is achieved to program a cell 10 via four nearest source contacts SC. During programming operation, depending on the location of the programmed cell 10, the source voltage $V_S$ increases to a few tenths of a volt due to the resistance of the source lines 17 and 17a.

Figure 11:
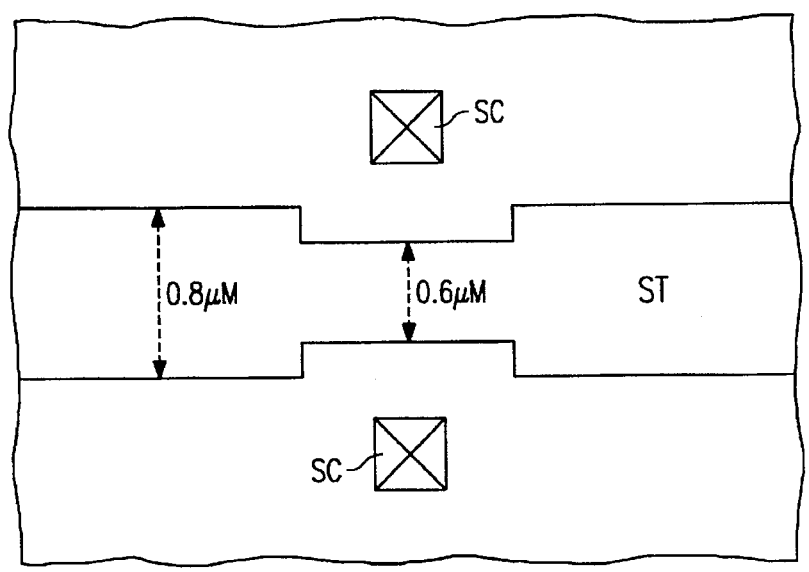
FIG. 11 is a plan view of a small part of a memory cell array having a narrowed straight-stack width.

As mentioned previously and as illustrated in FIG. 11, the proposed straight stack ST layout over the vertical source line 17a may optionally be trimmed by 0.1 to 0.2 cm from the nominal stack $S_T$ line width. This results in an even better conduction path under the stack $S_T$ and allows construction to be less process dependent.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

What is claimed is:

1. A nonvolatile memory array including a plurality of diffused horizontal source lines, each said diffused source line positioned between a pair of parallel horizontal stack conductors, said memory array comprising:

said plurality of diffused horizontal source lines connected to at least one common vertical source conductor;

said common vertical source conductor including continuous diffused regions under each of said pair of parallel horizontal stack conductors; and said common vertical source conductor including a metal conductor coupled to said continuous diffused regions at contacts located between said pairs of parallel horizontal stack conductors.

2. The nonvolatile memory array claim 1, wherein each of said parallel horizontal stack conductors is straight.

3. The nonvolatile memory array of claim 1, wherein said continuous diffused regions include phosphorous dopant.

4. The nonvolatile memory array of claim 1, wherein each of said pair of parallel horizontal stack conductors is narrower over said continuous diffused regions.

5. The nonvolatile memory of claim 1, further including field oxide regions under said stack conductors, said field oxide regions spaced at uniform distances to separate cells of said memory, said vertical source conductor located between at least two of said field oxide regions, wherein said two of said field oxide regions are said uniform distance apart.

6. The nonvolatile memory of claim 1, wherein said continuous diffused regions extend to include a plurality of said pairs of parallel horizontal stack conductors.

7. The nonvolatile memory of claim 1, wherein each said horizontal stack conductor has one layer.

8. The nonvolatile memory of claim 1, wherein each said horizontal stack conductor has two layers.

9. The nonvolatile memory of claim 1, wherein said continuous diffused regions include phosphorous.

* * * * *